United States Patent [19]

Marks et al.

[11] Patent Number: 5,128,628
[45] Date of Patent: Jul. 7, 1992

[54] SOLID STATE HIGH POWER AMPLIFIER MODULE

[75] Inventors: Ted M. Marks, Kendall Park; Claudio A. Marchini, Ocean; Nevin A. Albrecht, Belvidero; Robert F. Maggio, Sr., Somerville, all of N.J.

[73] Assignee: SGS-Thomson Microelectronics, Inc., Carrollton, Tex.

[21] Appl. No.: 634,027

[22] Filed: Dec. 26, 1990

[51] Int. Cl.⁵ ............................................... H03F 1/00
[52] U.S. Cl. ........................................ 330/66; 361/383
[58] Field of Search .................................... 330/65-68; 361/383, 384

[56] References Cited
FOREIGN PATENT DOCUMENTS
308247  3/1989  European Pat. Off. ............ 361/383

Primary Examiner—James B. Mullins
Attorney, Agent, or Firm—Allan Ratner; Lisa K. Jorgenson; Richard K. Robinson

[57] ABSTRACT

A module for use with a radial combiner comprised of a compartment on one side of a base that contains a plurality of amplifiers located on a printed circuit board having conductive patterns respectively coupling the amplifiers between points along a serial splitter and points along a serial combiner in which operating potential for the amplifiers is derived from storage capacitors connected between two conductors on a separate board via conductive spring fingers having one end attached to one of said conductors and the other end bearing against a conductive pad on the printed circuit board that is coupled to an electrode of an amplifier and in which a plenum is mounted along one edge of the module for conducting cooling air to a duct on the other side of the base.

20 Claims, 6 Drawing Sheets

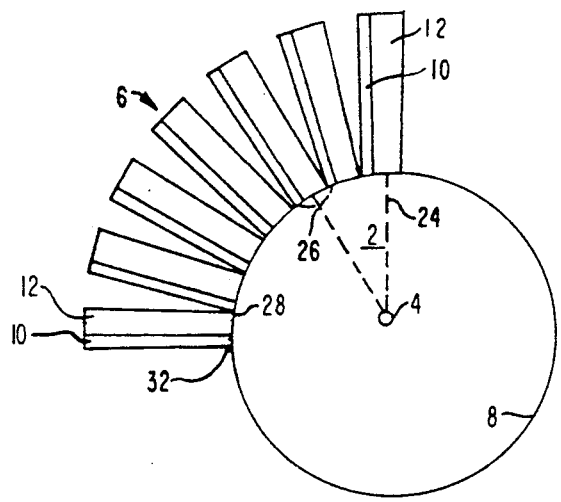
FIG. 1
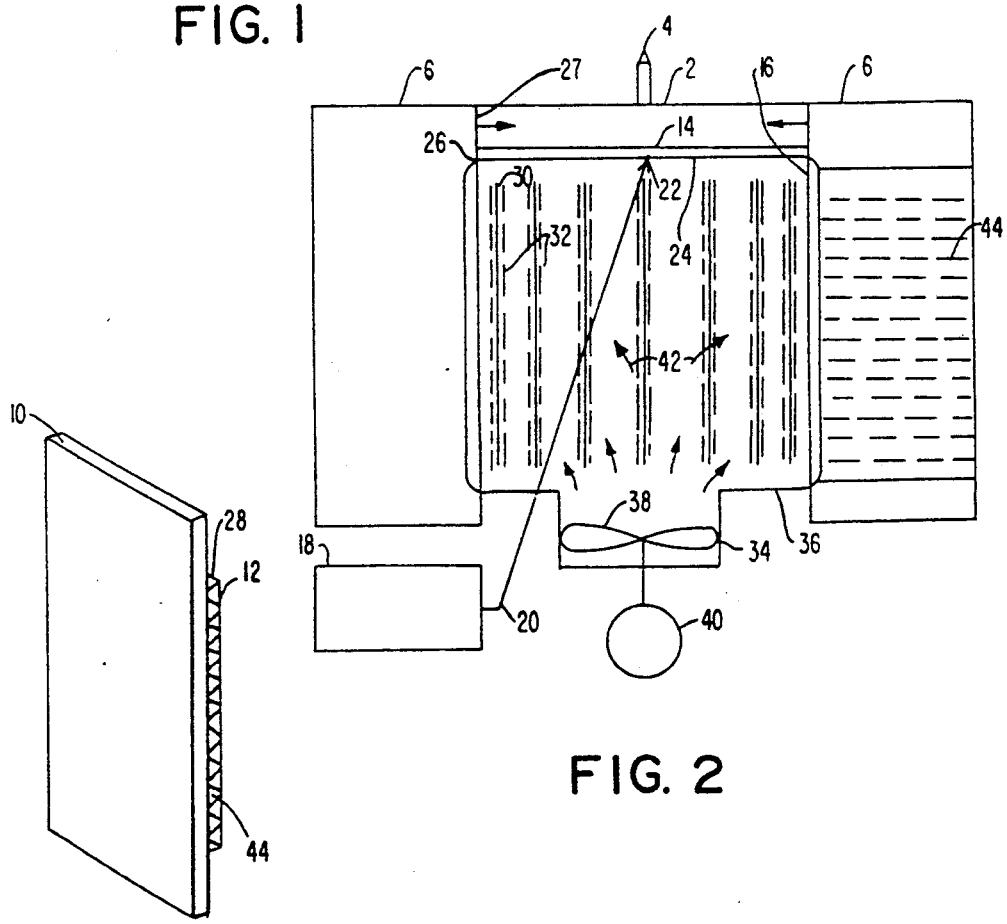
FIG. 2
FIG. 3

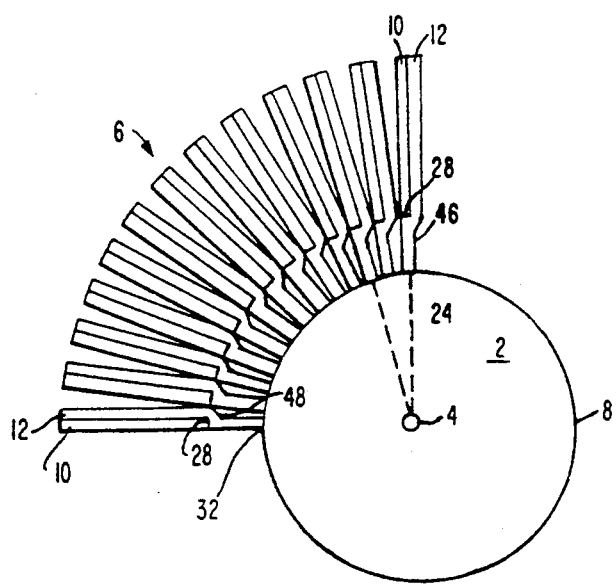
FIG. 4
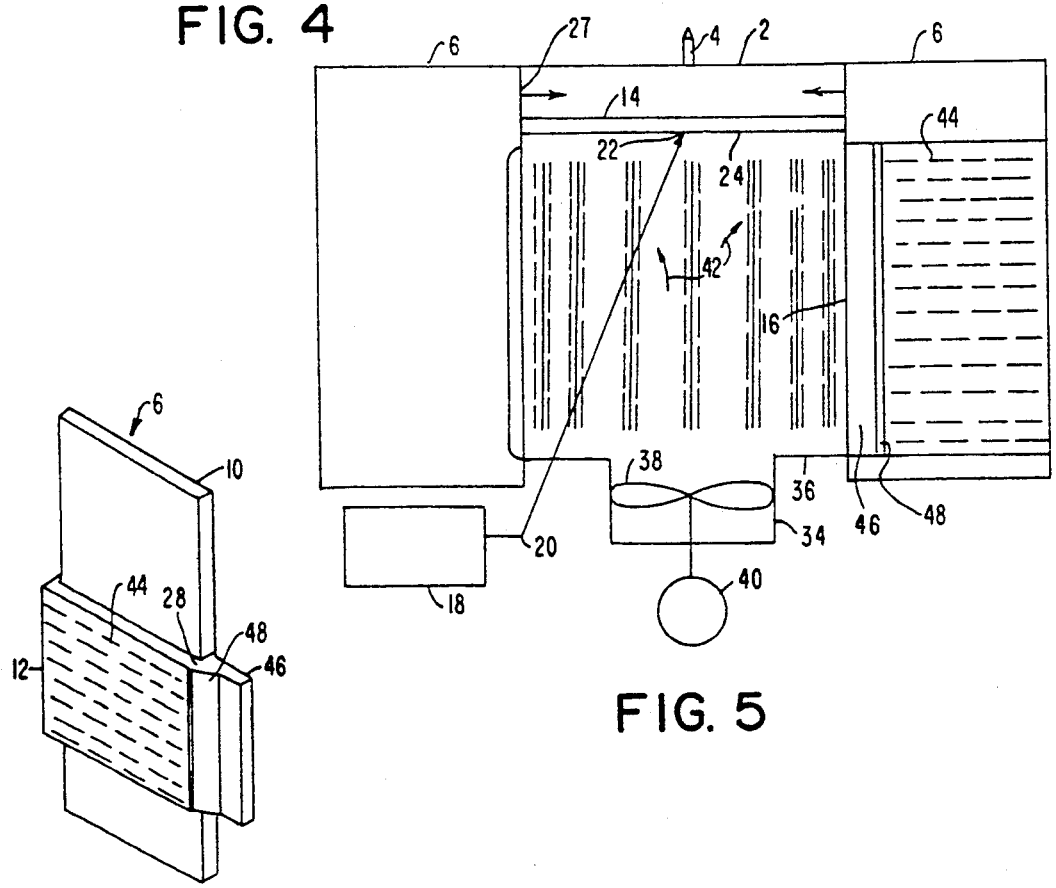
FIG. 5
FIG. 6

1

SOLID STATE HIGH POWER AMPLIFIER MODULE

FIELD OF INVENTION

This invention relates to the field of radio frequency amplification and in particular to amplification of pulses of radio frequency waves.

BACKGROUND OF THE INVENTION

Whereas the initial expense of producing radio frequency power with klystrons is less than that of producing it by combining the outputs of a number of solid state amplifiers, the long term expenses are greater because of the klystron's relatively short life. Furthermore, when a klystron fails, all radio frequency power is lost, but when even a few solid state amplifiers fail, only a portion of the radio frequency power is lost.

One advantageous way of combining the output power of a large number of solid state amplifiers is to operate a number of them in parallel in each of a plurality of modules and to apply the radio frequency outputs of the modules to a radial combiner such as described in an article by Bobby J. Sanders entitled "Radial Combiner Runs Circles Around Hybrids" appearing at pages 55-58 of the November 1980 issue of *Microwaves* and also in an article by Stephen J. Fote et al entitled "60 Way Radial Combiner Uses No Isolators" appearing at pages 96-100 and 118 of the July 1984 issue of *Microwaves*. The radial combiner is comprised of spaced circular conductive plates forming a radial waveguide that conducts radio frequency energy introduced at its circumference to an output electrode at the center of one of the plates. The outputs of the modules are coupled to points around the circumference of these plates so that the sum of their outputs appears at the electrode referred to.

Cooling of the modules is accomplished as follows. Electronic components including the solid state amplifiers are mounted on one side of a base of a tray, and passageways for cooling air are mounted on the other. The design has been such that the thickness of a module at the point where it is coupled to the circumferential edge of the radial combiner is the sum of the thickness of the side of the module containing the electrical components and the thickness of the cooling air passageways.

The total output power is, of course, proportional to the product of the number of modules coupled to the radial combiner and the number of solid state amplifiers contained in each module. The number of modules that can be coupled to the circumference of the radial combiner depends on their thickness. Since the length of the circumference of the radial combiner depends on the radio frequency involved, there is a limit to the number of modules of any given thickness that may be used. The number of amplifiers that can be used in a module is limited by the tolerance requirements for circuits that couple radio frequency energy to them.

Operating potential for the amplifiers is generally provided by storage capacitors that are mounted on the same printed circuit board as the amplifiers. In some designs they are mounted between the amplifiers so as to increase the length and thus the power losses of the serial splitter and serial combiner that respectively couple power to and from them. In other designs, the storage capacitors are mounted on top of the respective amplifiers so that they have to be unsoldered and resoldered when an amplifier is being replaced.

BRIEF DESCRIPTION OF MODULE CONSTRUCTED IN ACCORDANCE WITH THIS INVENTION

A module constructed in accordance with this invention is shaped so that more of them can be attached around the circumference of a radial combiner than was previously possible while still permitting adequate cooling air to flow to cooling passageways. Briefly, this is accomplished by adding a plenum along one edge of the module and coupling it to the cooling passageways. The plenum is thinner than the rest of the module and is attached to the circumferencial edge of the radial combiner so that more modules may be used.

In accordance with another aspect of this invention, the module is constructed so that the serial splitter and serial combiner have a minimum length for the number of amplifiers operated in parallel while at the same time providing easy access to the amplifiers. This is accomplished by mounting the storage capacitors on a separate printed circuit capacitor board that is removeably positioned over the radio frequency circuit board for the solid state radio frequency power amplifiers and connecting the capacitors to appropriate electrodes of the amplifiers via conductive spring fingers that are held in compression.

BRIEF DESCRIPTION OF THE DRAWINGS

FIG. 1 is a top view of a radial combiner of the prior art;

FIG. 2 is a vertical section of FIG. 1;

FIG. 3 is a perspective view of a module shown in FIGS. 1 and 2;

FIG. 4 is a top view of a radial combiner constructed in accordance with this invention;

FIG. 5 is a vertical section view of the radial combiner of FIG. 4;

FIG. 6 is a perspective view of a module shown in FIGS. 4 and 5;

DETAILED DESCRIPTION OF AN EMBODIMENT OF THE INVENTION

Figure 7:
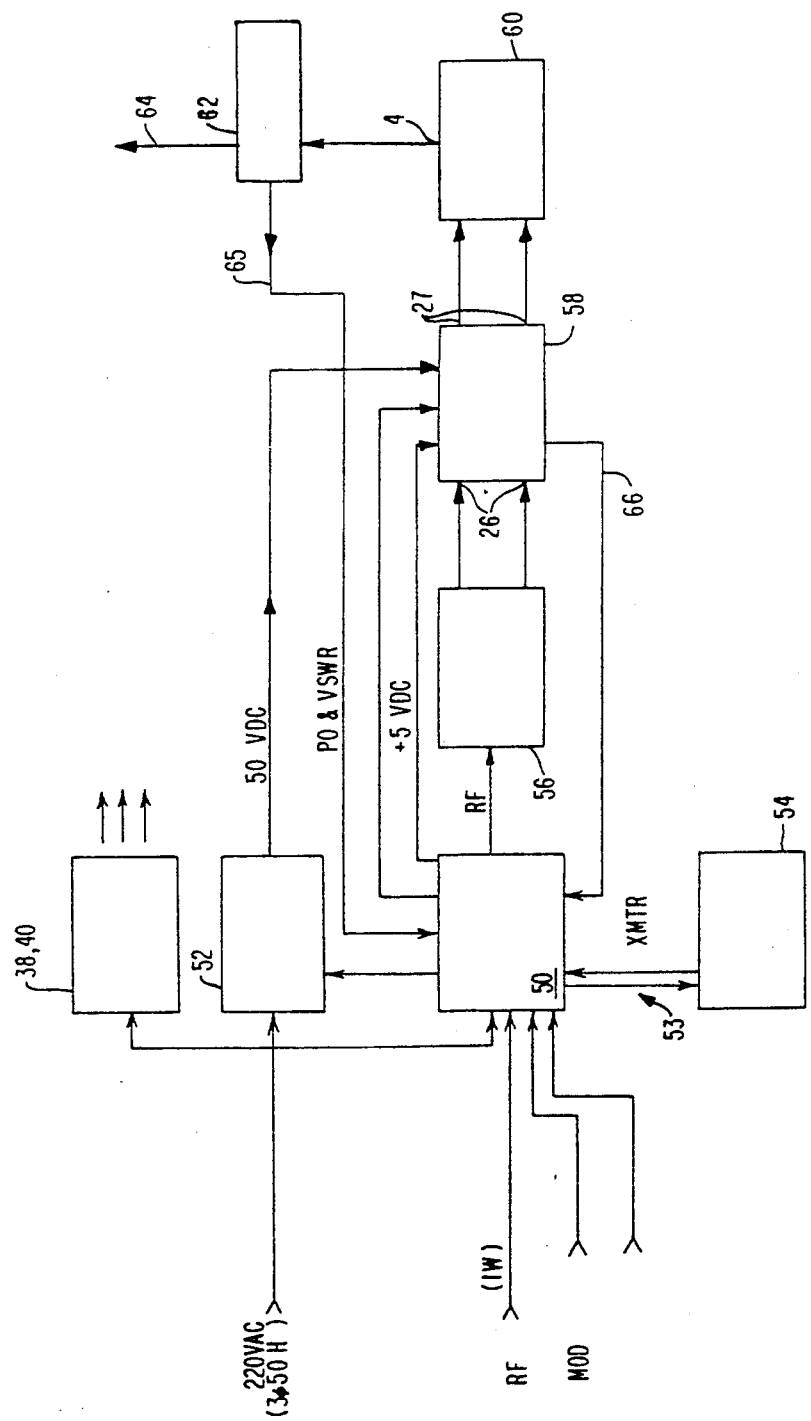
FIG. 7 is a block diagram of a system utilizing a radial combiner and a number of modules.

Corresponding components in different figures of the drawings are designated in the same way.

FIGS. 1, 2, and 3 illustrate prior art. FIG. 1 shows a top plate 2 of a radial combiner having an output terminal 4 and a plurality of modules 6 attached around its circumferential edge 8. The circumferential thickness of a module 6 at its point of connection to the plate 2 is the sum of the thickness of a radio frequency amplifier section 10 and a cooling duct 12.

In FIG. 2, the bottom circular plate 14 of the radial combiner is shown along with a hollow cylinder 16 depending from and coaxial with the plate 14. Radio frequency signals from a source 18 are coupled via a cable 20 to the center 22 of a splitter in the form of radial conductors 24. The conductors 24 are also shown by dotted lines in FIG. 1. The number of radial conductors 24 is half the number of the modules 6, and a Wilkinson splitter couples the outer ends of each conductor to the input terminals 26 of adjacent modules. Output terminals 27 of the modules are coupled to the circumference of the radial combiner 2, 4, 14.

Cooling of the modules 6 is accomplished by aligning the vertical edges 28 of the ducts 12 shown in the perspective view of FIG. 3 with axial slits 30 in the cylinder 16 shown in FIG. 2 and sealing the connections with gaskets 32 or other suitable means that are shown in dashed lines. Another hollow cylinder 34 is mounted in the center of an annular disk 36 that is attached to the bottom of the cylinder 16, and a fan 38 that is mounted in the cylinder 34 is rotated by a motor 40. Cooling air flows by action of the fan 38 through the cylinder 16 as indicated by the arrows 42, through the slits 30 and the duct 6 on the side of each module. Preferably, the duct 6 is divided into a multiplicity of passageways 44, FIG. 3, that are perpendicular to the axis of this cylinder 16. Thus the circumferential dimension of a module at the point of coupling to the cylinder 16 is the sum of the thickness of the amplifier section 10 and the duct 12.

FIGS. 4, 5 and 6 generally correspond to FIGS. 1, 2 and 3 respectively, but illustrate how more modules may be attached to a radial combiner in accordance with one aspect of the invention. The modules 6 are outwardly the same as the module of the prior art except for the addition of a plenum 46. In this particular embodiment, the cross section of the plenum 46 lies in an extension of the cross section of the amplifier section 10 and is coupled to the edge 28 and thus to the ends of the passageways 44 in the duct 12 via a sloping section 48. These elements of the construction are more clearly presented in FIG. 6. Alternatively, for example, the plenum 46 could be an extension of the duct 12.

Figure 12:
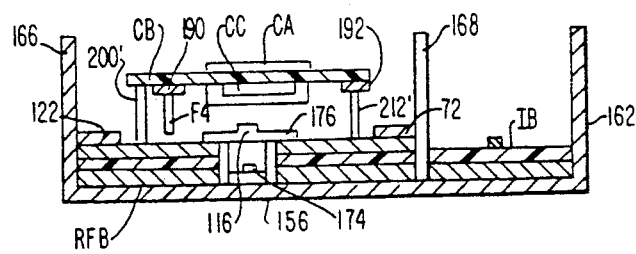
FIG. 12 is a cross section AA of FIG. 11.

Reference is now made to the block diagram of FIG. 7 12 illustrating a transmitter utilizing a radial combiner. A low power radio frequency signal, such as 1 watt, is supplied to a control unit 50. The control unit 50 turns power supplies, 52 on or off, controls blowers 38, 40 of cooling air and provides fault signals via a cable 53 to a remote monitor 54. The control unit 50 also supplies the radio frequency signal to a splitter 56, such as the radial conductors 24 of FIG. 2, that couples the radio frequency signals to the input terminals 26 of the modules. The modules are indicated by a block 58. The output terminals 27 of the modules 6 are coupled to a radial combiner represented by a block 60, and its output terminal 4 is coupled by a coupler 62 to an output terminal 64 for the system. The amount of power at the output 64 is monitored by means not shown, and an indication thereof is sent via a lead 65 to the control unit 50. The indication is then sent to the remote monitor 54 via the cable 53. Any faults occurring in the modules 58 are carried by a lead 66 to the control unit 50 and conveyed to the monitor 54 via the cable 53. The particular module involved is selected by an address from the control unit 50.

Figure 8:
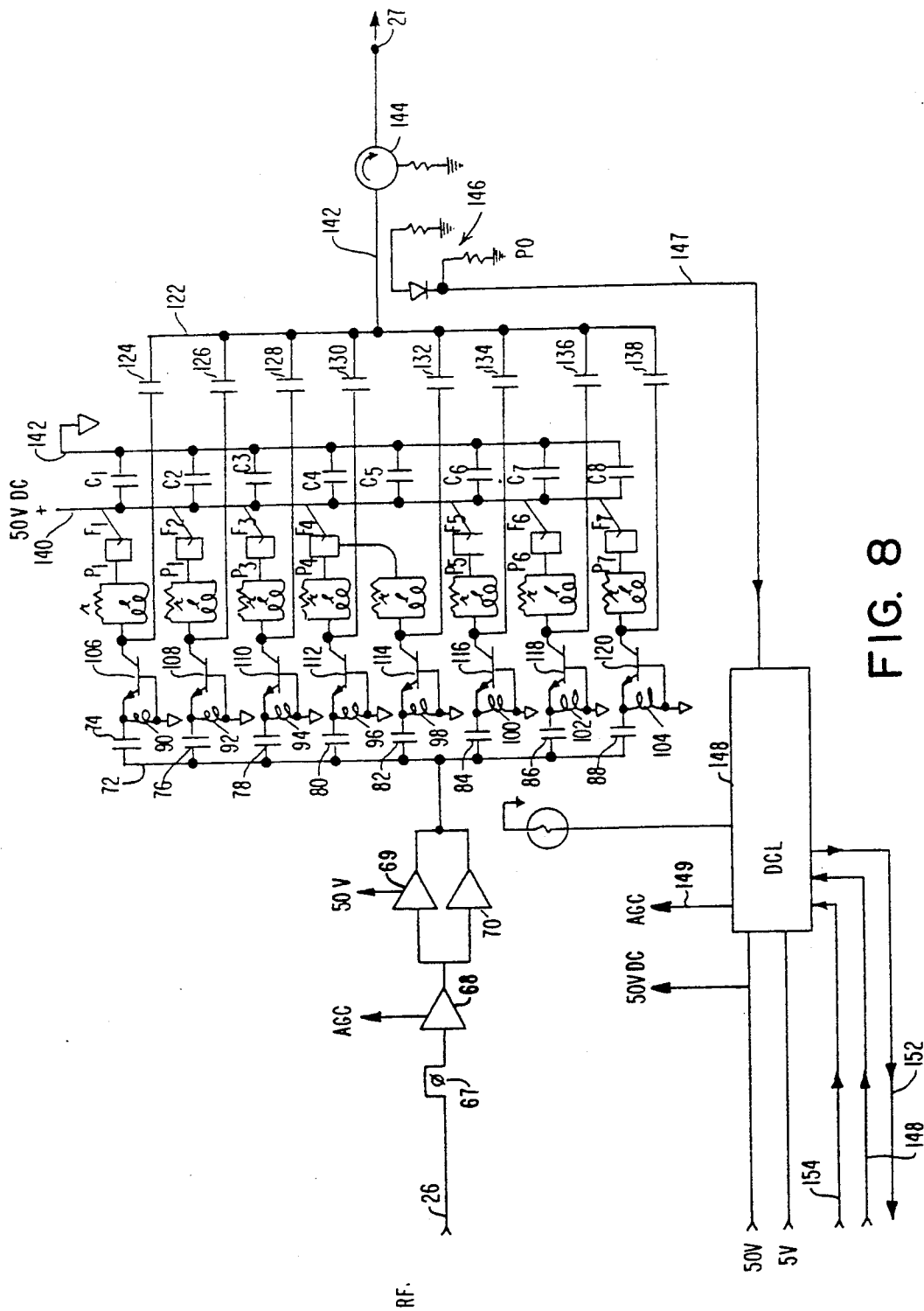
FIG. 8 is a block diagram of the electrical circuits of a module.

FIG. 8 is a schematic diagram of a module 6. The signal on input terminal 26 is phase adjusted, by means 65 and is applied via a gain controlled amplifier 66 and two parallel driver amplifiers 68 and 70 to one end of a serial splitter 72. The splitter 72 is respectively coupled at points therealong via matching circuits schematically represented by capacitors 74, 76, 78, 80, 82, 84, 86 and inductors 90, 92, 94, 96, 98, 100, 102 and 104 to the emitters of power amplifiers 106, 108, 110, 112, 114, 116, 118 and 120. The serial splitter contains circuit elements not shown for coupling the same amount of radio frequency power to each of the power amplifiers. It is the tolerances of these circuits that sets the practicable limit of the number of amplifiers that may be used in a module.

The collectors of the power amplifiers 106, 108, 110, 112, 114, 116, 118 and 120 are respectively coupled to a serial combiner 122 via matching circuits represented by capacitors 124, 126, 128, 130, 132, 134, 136 and 138.

Operating voltages for the collectors of the power amplifiers 106, 108, 110, 112, 114, 116, 118 are provided in the following manner. A suitable D.C. voltage is applied to a D.C. bus 140, and storage capacitances C1-C8 are connected from spaced points along the bus 140 to spaced points along a ground bus 142. As will be subsequently illustrated, each of the storage capacitances C1-C8 and comprised of a number of capacitors having different discharge characteristics so as to prevent distortion. 14 In accordance with this invention, the buses 140, 142 and the capacitances C1-C8 are mounted as illustrated in FIGS. 9-13 on a capacitor board CB that is separate from a radio frequency board RFB on which the power amplifiers 108, 110, 112, 114, 116, 118 and 120 and their coupling circuits are mounted. In FIG. 8 various spaced points along the bus 140 on the capacitor board are connected via conductive spring fingers F1-F7 to pads P1-P7 on the radio frequency board. The pads are respectively coupled to the collectors of the power amplifiers 106, 108, 110, 112, 114, 116, 118 and 120 via individual parasitic suppressors, l, r.

The serial combiner 122 is coupled via a lead 142 and a circulator 14 to the output terminal 27 for the module. A detector circuit 146 that is coupled to the lead 142 provides a D.C. voltage on a lead 147 that is indicative of the radio frequency output power supplied by the module. The lead 147 is connected to a control board 148 that supplies the voltage on the lead 149 to an AGC control input of the amplifier 66. Data relating to the operation of the module is supplied by the control board 148 to the control unit 50 (FIG. 7) via a data line 152 when the module is addressed on an address line 154. The data is also relayed to the remote monitor 54 via the cable 53.

Reference is now made to FIGS. 9-13 for a description of a physical embodiment of a module constructed in accordance with this invention. In order to simplify the drawings, only the first six of the power amplifiers 106, 108, 110, 112, 114, 116, 118 and 120 are shown.

The radio frequency signals supplied to the input terminal 26 of the module from the splitter of FIG. 5 are phase adjusted by means 65 and amplified by the gain controlled amplifier 66 and drivers 68 and 70 on an input printed circuit board IB. The board IB is attached to a base 156 of a metal tray 158 having exterior walls 160, 162, 164 and 166 and interior walls 168 and 170 extending upwardly from the base 156 toward the viewer. The input board IB is between the exterior wall 162 and the interior wall 168, and the outputs of the amplifiers 68, 70 are coupled to the lower end of the serial splitter 72 that runs along the left side of the inner wall 168. The power amplifiers 106, 108, 110, 112, 114 and 116 are mounted in respective openings 106', 108', 110', 112', 114', and 116' in the radio frequency amplifier board RFB that extend through the board RFB so as to expose the base 156 of the tray 158. Only the matching circuits for the power amplifier 116 need be described because the matching circuits for the other amplifiers are identical. Furthermore, all the details of the matching circuits are not shown because they are known to those skilled in the art.

The base electrode for the amplifier 116 is connected to the top and bottom flanges 172 and 174 that are screwed to the base 156 of the tray 158 so that heat can pass directly from the transistor amplifier 116 to the base. Thus there is only one metal to metal interface whereas mounting the transistor 116 on the metal ground plane of RFB that underlies the substrate on which the circuits are formed would have two metal to metal interfaces. An emitter lead 176 of the amplifier 116 is soldered to one end of a printed matching circuit 178, and the other end is connected to the serial splitter 72. A collector lead 180 is soldered to one end of a printed matching circuit 182, and the other end connected to the serial combiner 122. D.C. voltage for the collector electrodes of the amplifier 116 is provided via a parasitic suppressor 184 connected to the pad P5. The application of voltage to the pad P5 will be described by references to FIGS. 10 and 11.

The serial combiner 122 is coupled via the conductor 142 and the circulator 144 to the output terminal 27 for the module. Voltage corresponding to the power output of the module is derived by coupling energy along the line 142 to the detector circuit 146, and the output of the circuit 146 is connected to the control board 148 via the conductor 147.

Application of operating potential for the power transistors 106, 108, 110, 112, 114 and 116 to the pads P1-P5 on the circuit board RFB is accomplished in accordance with the invention by the following structure shown in FIGS. 10-13.

Figures 9, 10:
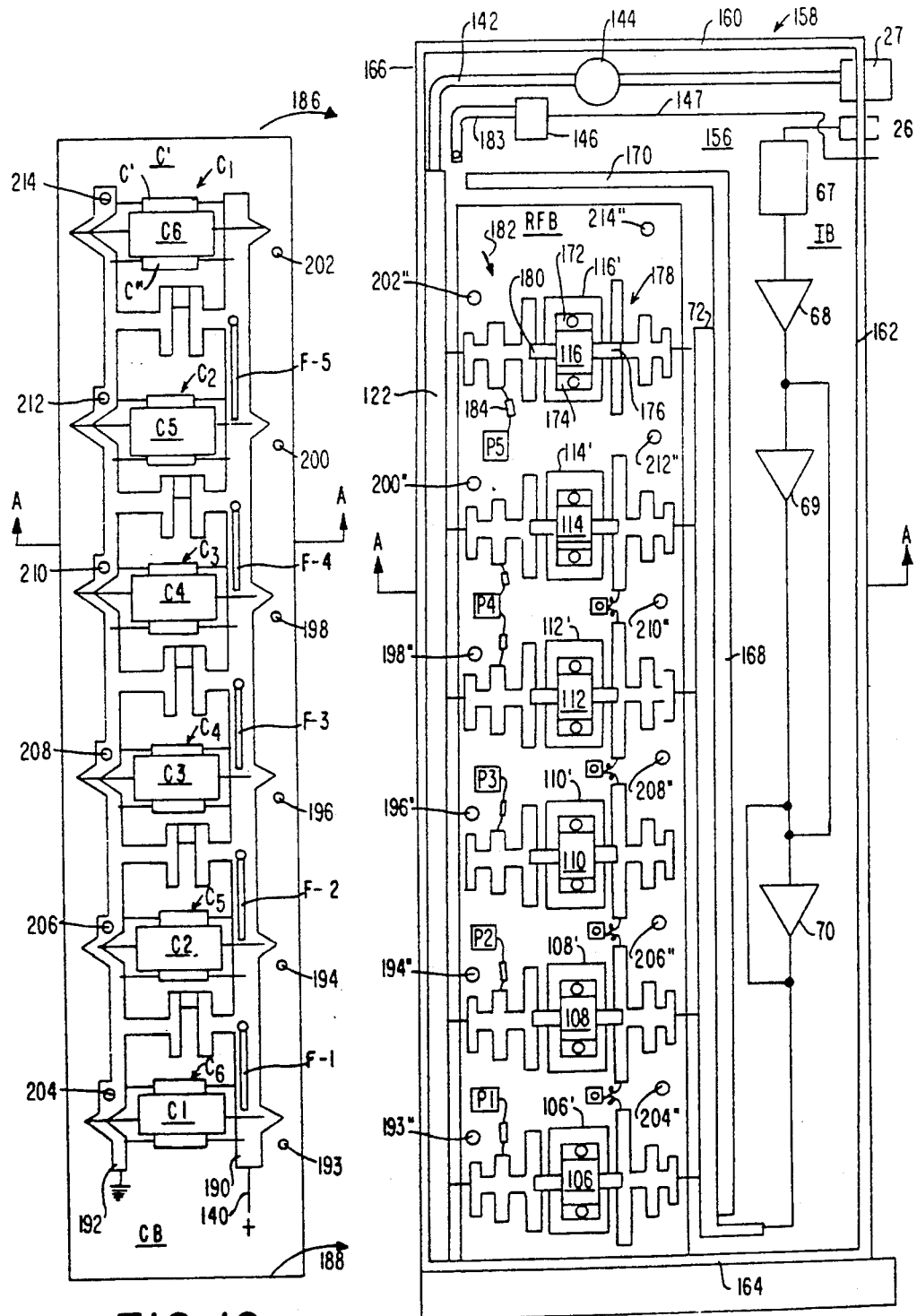
FIG. 9 illustrates the physical layout of amplifying components of a module of this invention.
FIG. 10 illustrates the electrical components of a storage capacitor board of this invention.

In FIG. 10, the side of the storage capacitor circuit board CB on which the printed circuits are formed is shown so that the board must be rotated about its right side as indicated by the arrows 186 and 188 to place it in the proper position on top of the board RFB; i.e., turned as one would turn a page of a book.

The circuit board CB has a conductor of conductive strip 190 to which an operating D.C. voltage 191 is applied and a grounded conductor or conductive strip 192 that is parallel to the conductor 190. Storage capacitances C1-C5 are soldered between the conductors 190 and 192 at spaced points. The 50 V D.C. voltage 191 of FIG. 8 is applied to the conductor 190. Each storage capacitance is shown as being comprised of four capacitors C,C',C" and C"' having different discharge characteristics. In a 2500 watt module having eight amplifiers, each capacitor C could have 220 uf and provide its voltage for 100 u s, each capacitor C' and C" could have 22 uf and provide its voltage for 10 u s and each capacitor C"' could have 1 uf and would have a very low resistance so as to provide a voltage that can follow the rise time of a cycle of radio frequency and cancel ringing. The flexible spring fingers F1-F5 are attached at spaced points to the ungrounded conductor 190 and extend toward the viewer such that the free ends will impinge upon the pads P1-P5 when the board is mounted in position. In this particular embodiment, there are fewer pads than amplifiers so that the collectors of the amplifiers 112 and 114 are both connected to the pad P3.

Figure 11:
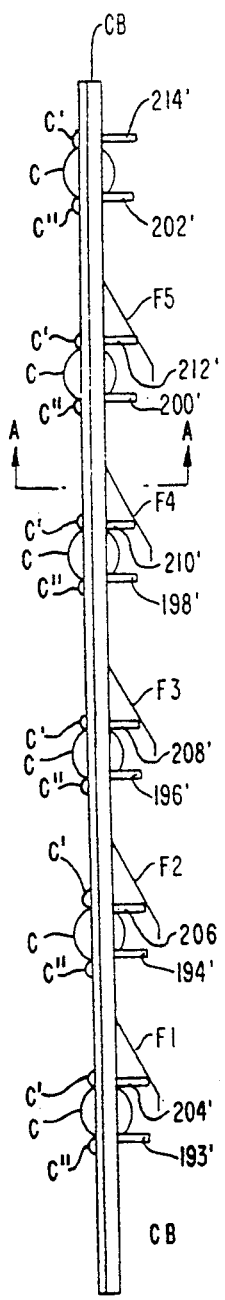
FIG. 11 is an elevational view of the capacitor board of FIG. 10.

In FIG. 11, which is a side view of FIG. 10, the free ends of the spring fingers F1-F5 are seen to be respectively aligned with the pads P1-P5. When circuit board CB is mounted on RFB, screws, not shown, extend through holes 192, 194, 196, 198, 200 and 202 in the circuit board CB, through spacers 192', 194', 196', 199', 200' and 202' on the underside of CB, through holes 192", 194", 196", 198", 200" and 202" in RFB and into the base 156 of the tray 158. Note that no electrical connections are made by these screws to circuits on CB or RFB so that they are merely or mechanical assembly.

Screws, not shown, extend through holes 204, 206, 208, 210, 212 and 214 in CB that are located in the conductor 192, through spacers 204', 206', 208', 210' and 214', through holes 204", 206", 208", 210", 212" and 214" in RFB and into the base 156 of the tray 1258 so as to ground the conductor 192. The spacers are shorter then the distance between CB and the free ends of the spring fingers F1-F5 so that when the screws are tightened, the spring fingers make good electrical contact with their respective pads. Both the spring F1-F5 fingers and the pads P1-P5 are gold plated.

FIG. 12 is a cross-sectional view of the assembled module showing what would be seen when looking in the direction AA. Note that the spring finger F4 does not go all the way to the top of RFB because of the location of the section AA and that P5 is hidden by the output matching circuit for the amplifier 114.

Figure 13:
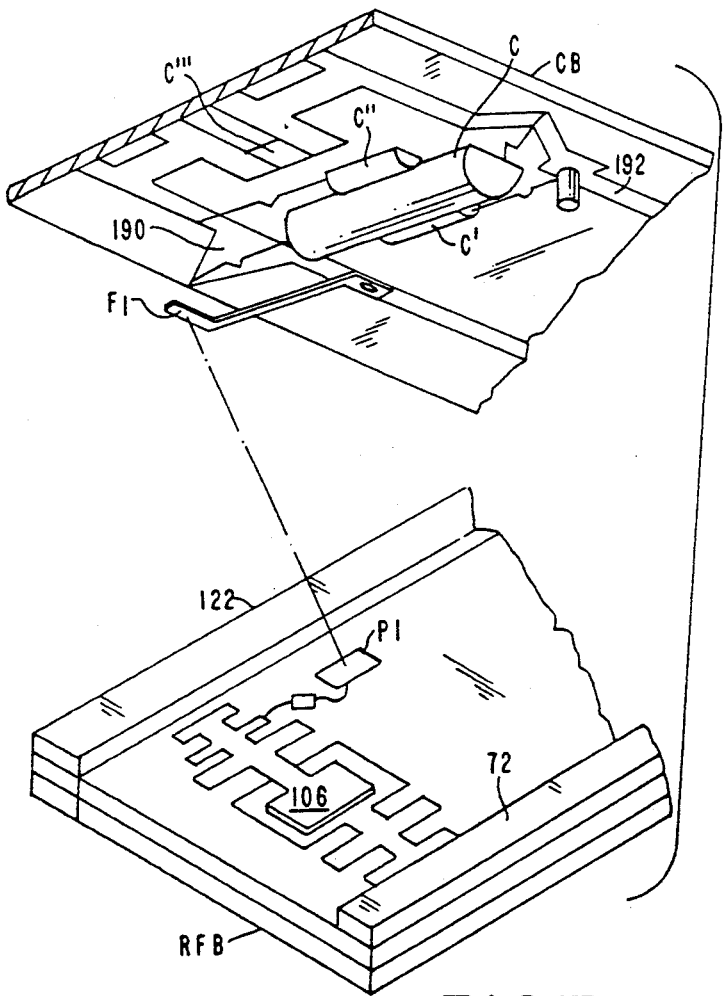
FIG. 13 is a perspective view illustrating the relative positions of the amplifying components of FIG. 9 and the storage capacitor board of FIG. 10.

Reference is now made to the perspective view of FIG. 13 showing the relative positions of the printed circuit boards RFB and CB when in the assembled position. Note that when circuit board CB is fastened to RFB by the screws, the free end of the spring finger F1 will be in contact with the pad P1. The spacers are not visible in this view.

The plenum is preferable sloped, as shown, so as to couple the air duct to an opening in registration with an extension of the compartment containing the electrical components in order that the electrical connections and the coupling to the slits 30 can both be along a radial line. Otherwise, the electrical connections would have to be at an angle so as to require additional electrical loss and expense.

What is claimed is:

1. In a module for use with a radial combiner of radio frequency signals, the combination of:
   a serial splitter;
   a serial combiner;
   a plurality of amplifiers respectively having an input and an output;
   a printed circuit board having conductive patterns thereon for respectively coupling radio frequency energy from said serial splitter to the inputs of said amplifiers;
   said printed circuit board also having conductive patterns thereon for respectively coupling said outputs of said amplifiers to said serial combiner;
   said printed circuit board having means including conductive pads for respectively coupling D.C. operating potential to said amplifiers;
   a capacitor board having first and second conductive strips formed thereon;
   capacitors connected between said first and second conductive strips at spaced points therealong; and
   a plurality of conductive spring fingers having ends conductively attached to said first conductive strip at points such that the other ends are respectively in contact with said pads.

2. The combination as set forth in claim 1 further comprising:
a tray having a base;
means forming a compartment on one side of said base;
means for mounting said serial splitter, said serial combiner, said printed circuit board and said amplifiers in said compartment;
means forming a duct on the other side of said base; and
a plenum coupled to said duct.

3. A combination as set forth in claim 2 wherein;
the thickness of said plenum in a direction perpendicular to said base is less than the sum of the thickness of said compartment and the thickness of said duct in said direction.

4. A combination as set forth in claim 3 wherein said means forming said duct includes a plurality of passageways.

5. A combination as set forth in claim 4 further comprising;
means including apertures in said printed circuit board for mounting said amplifiers in direct contact with said base.

6. A combination as set forth in claim 5 wherein said base is made of metal.

7. A combination as set forth in claim 6 further comprising:
means for connecting one electrode of each amplifier to said base.

8. A module as set forth in claim 5 further comprising:
means defining an opening lying in an extension of a cross section of said tray; and
said plenum sloping from said duct to said opening.

9. A combination as set forth in claim 1 further comprising:
a source of D.C. potential;
means for coupling said source to said first conductive strip;
a source of reference potential; and
means for coupling said source of reference potential to said second conductive strip.

10. A module for use with a radio frequency combiner comprising:
a metal tray;
a radio frequency input terminal insulatively mounted to said tray;
a serial splitter mounted on one side of said tray;
amplifying means mounted on said one side of said tray;
means including said amplifying means electrically coupling said radio frequency input terminal and one end of said serial splitter;
a serial combiner mounted on said one side of said tray;
a radio frequency printed circuit board having an insulating substrate mounted on a metal ground plane, said ground plane being in contact with said one side of said tray;
a plurality of power amplifiers mounted at respective locations along said printed circuit board between said serial splitter and said serial combiner; said power amplifiers having base, emitter and collector electrodes;
means for electrically connecting said base electrodes to said tray;
first conductive patterns on said substrate for coupling one of said emitter and collector electrodes to said serial splitter;
second conductive patterns on said substrate for coupling the other of said emitter and collector electrodes to said serial combiner;
a radio frequency output terminal insulatively mounted to said tray and electrically connected to said serial combiner;
a storage capacitor board having first and second spaced conductive strips thereon;
means for applying a D.C. potential to said first conductive strip;
means for electrically connecting said second conductive strip to said tray;
a plurality of storage capacitors mounted at spaced positions along said capacitor board, that are electrically connected between said first and second conductive strips;
a plurality of conductive pads on said printed circuit board respectively located adjacent said power amplifiers;
means respectively coupling said pads to electrodes of said power amplifiers; and
electrically conductive spring fingers mounted on said storage capacitor board at spaced positions along said first conductive strip and in electrical contact therewith, said spring fingers respectively extending between said capacitor board and said pads.

11. In a module for use with a radio frequency combiner, the combination of:
a metal tray;
a plurality of power amplifiers mounted on one side of said tray, said amplifiers having input and output electrodes;
an input terminal;
means coupling said input terminal to the input electrodes of said power amplifiers;
an output terminal;
means coupling said output terminal to the output electrodes of said power amplifiers;
a storage capacitor board having first and second conductors on it;
means for electrically connecting said first conductor to said tray;
a plurality of storage capacitors mounted on said storage capacitor board and connected between said first and second conductors at spaced points therealong;
a plurality of spaced conductive spring fingers connected at spaced points to said second conductor;
a plurality of conductive pads respectively mounted adjacent said amplifiers;
means for mounting said storage capacitor board on said tray so that ends of said spring fingers are respectively pressed against said pads; and
means for respectively coupling said pads to electrodes of said power amplifiers.

12. The combination of claim 11 further comprising:
means defining an opening extending parallel to an edge of said tray and lying within a projection of said edge;
means forming a duct on the other side of said tray; and
a sloping plenum coupled between said duct and said opening whereby air forced through said opening passes through said plenum and said duct so a to cool said tray.

13. The combination as set forth in claim 12 wherein said input and output terminals extend from said edge.

14. The combination of claim 11 wherein:
said means for coupling said input terminal to said input electrodes of said power amplifiers and said means for coupling said output electrodes to said output electrodes of said power amplifiers include conductive patterns on a substrate of a printed circuit board; and
said printed circuit board has means defining a plurality of apertures therein; and
means for respectively mounting said power amplifiers in said apertures and in contact with said tray.

15. A module for use with a radial combiner comprising:
a heat sink in the form of a flat base;
means for defining a compartment on one side of said base;
a plurality of amplifiers mounted in said compartment respectively in thermal contact with said base;
means defining a duct on the other side of said base; and
a plenum that is thinner than the combined thickness of said compartment and said duct in a direction perpendicular to said base extending from an edge of said base and coupled to said duct so that any cooling air passing through said plenum passes through said duct.

16. A module as set forth in claim 15 wherein:
said plenum defines an opening aligned with said compartment and has a sloping section coupling said opening to said duct.

17. A module as set forth in claim 15 further comprising:
a board having first and second conductive strips thereon;
a plurality of storage capacitors respectively connected between spaced points along said first and second conductive strips; and
means including conductive spring fingers for respectively coupling spaced points along one of said conductive strips to said amplifiers.

18. A module as set forth in claim 17:
an input terminal;
a serial splitter having an input and a plurality of outputs;
means for coupling said input terminal to said input of said serial splitter;
an output terminal;
a serial combiner having a plurality of inputs and an output;
means for coupling said output of said serial combiner to said output terminal; and
means for respectively coupling said amplifiers between outputs of said serial splitter and inputs of said serial combiner.

19. A module as set forth in claim 18 wherein:
said means for respectively coupling said amplifiers is comprised of a printed circuit having a plurality of conductive pads thereon; and connections between each amplifier and a pad;
one end of each spring finger is connectively mounted on said one conductive strip and the other end is in contact with one of said pads.

20. A module as set forth in claim 19 further comprising:
means for applying a D.C. potential to said one conductive strip; and
means for connecting the other conductive strip to said base.

* * * * *